United States Patent [19]

Burns

[11] 4,000,842
[45] Jan. 4, 1977

[54] COPPER-TO-GOLD THERMAL COMPRESSION GANG BONDING OF INTERCONNECT LEADS TO SEMICONDUCTIVE DEVICES

[75] Inventor: Carmen D. Burns, San Jose, Calif.
[73] Assignee: National Semiconductor Corporation, Santa Clara, Calif.
[22] Filed: June 2, 1975
[21] Appl. No.: 582,620
[52] U.S. Cl. .............................. 228/180 A; 357/71
[51] Int. Cl.² ................ B23K 19/00; H01L 21/603
[58] Field of Search .............. 228/179, 180 A, 263; 29/589; 357/71

[56] References Cited
UNITED STATES PATENTS

| | | | |
|---|---|---|---|
| 3,396,454 | 8/1968 | Murdock et al. | 228/180 |
| 3,713,575 | 1/1973 | Cushman | 228/180 |
| 3,760,238 | 9/1973 | Hamer et al. | 357/71 X |
| 3,787,958 | 1/1974 | Freedman et al. | 228/179 X |
| 3,838,984 | 10/1974 | Crane et al. | 228/180 X |

*Primary Examiner*—Al Lawrence Smith
*Assistant Examiner*—K. J. Ramsey
*Attorney, Agent, or Firm*—Lowhurst & Aine

[57] ABSTRACT

Gang bonding structures for connecting a semiconductive device to associated circuitry includes both copper and gold portions which are heated and pressed into thermal compression bonding relation. The resultant bond comprises a solid state interdiffusion of the copper and gold portions to obtain, upon cooling thereof, a bonding interface between the copper and gold portions comprising a solid state interdiffusion of the copper and the gold. In a preferred embodiment such copper-to-gold thermal compression bonds are obtained between copper portions of gang bonding bumps on the semiconductive device and the inner ends of a copper interconnect lead structure as well as between the outer ends of the copper lead structure and gold plated inner ends of the lead frame structure of a base metal as of copper, nickel, or kovar.

14 Claims, 7 Drawing Figures

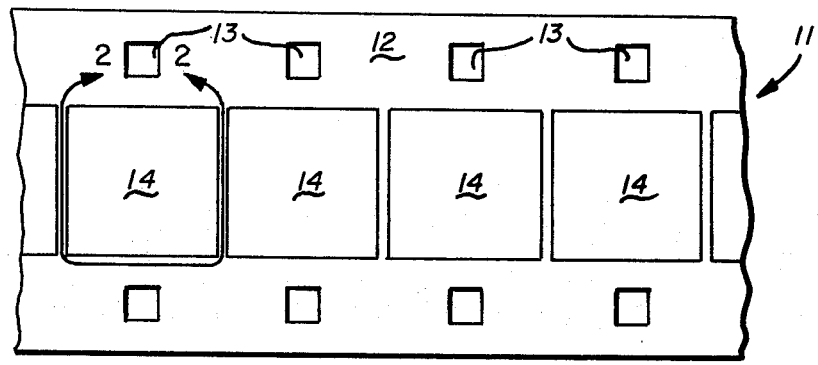
Fig_1
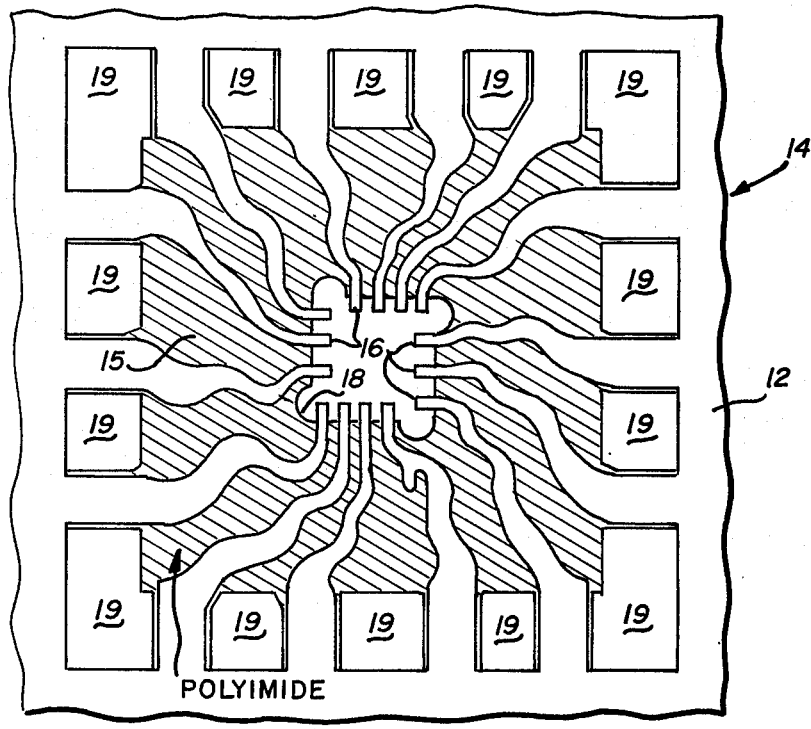
Fig_2
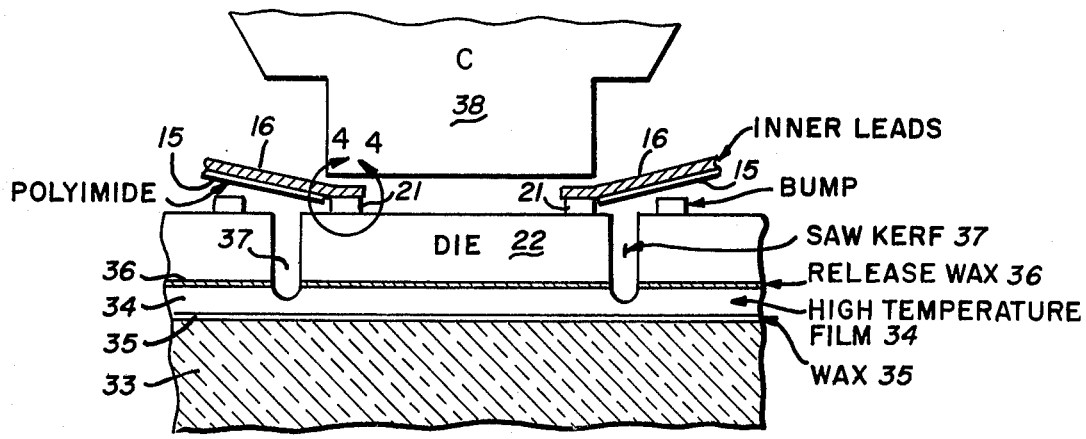
Fig_3

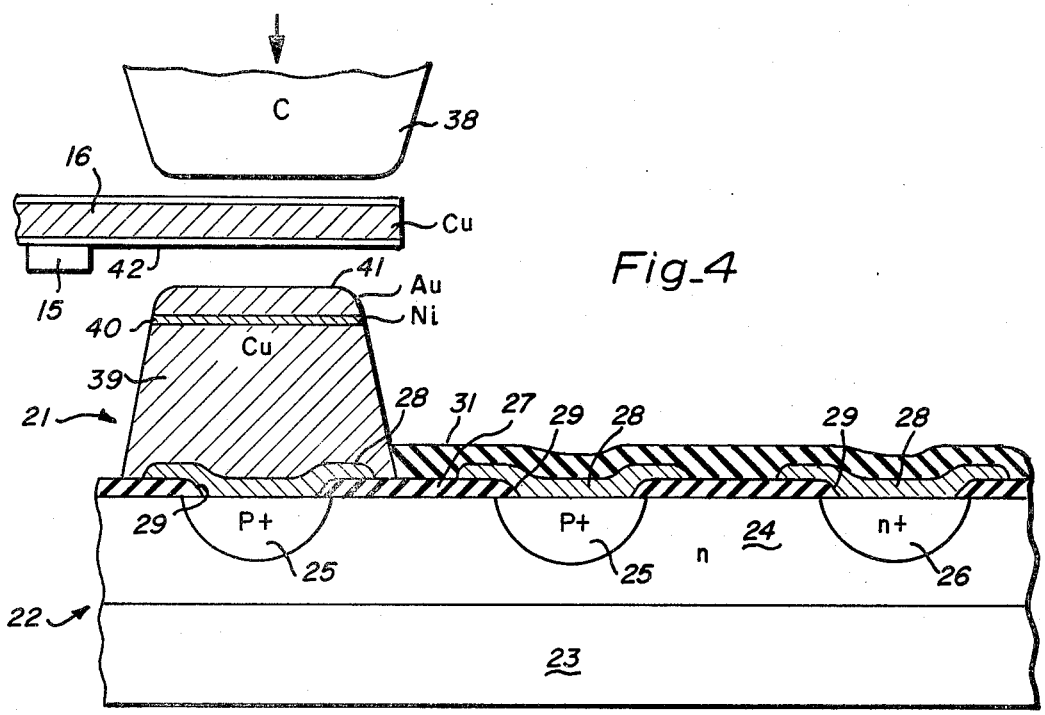
Fig_4
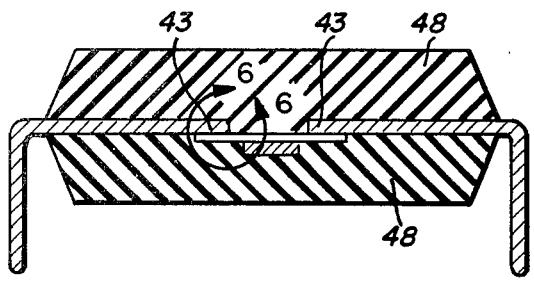
Fig_5
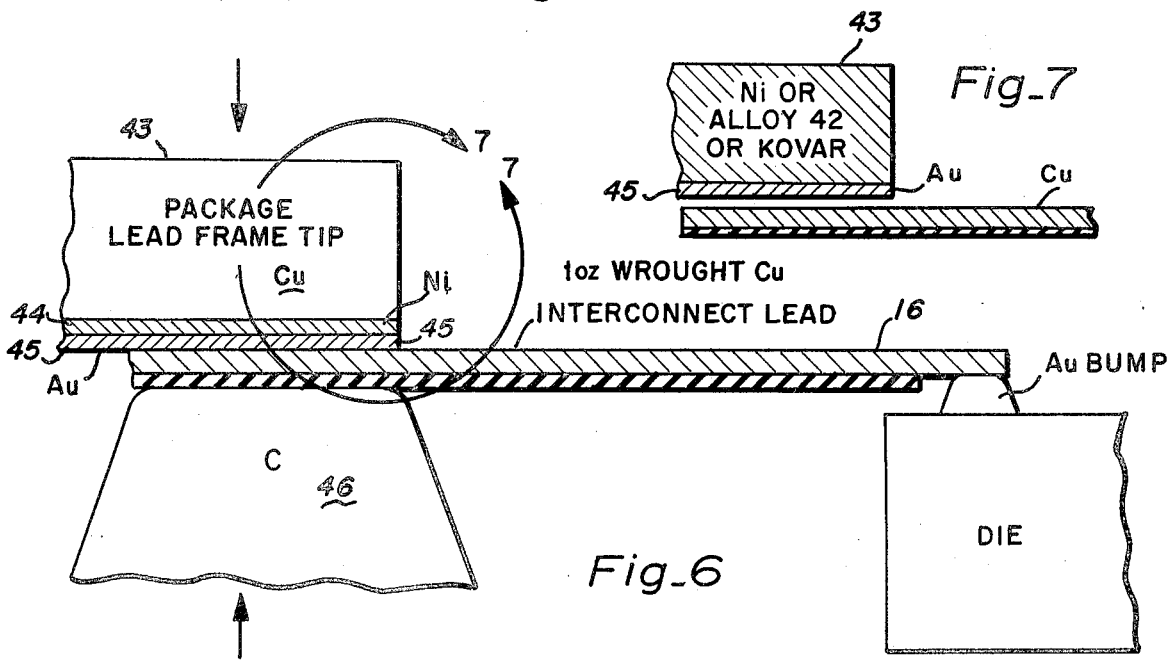
Fig_7
Fig_6

COPPER-TO-GOLD THERMAL COMPRESSION GANG BONDING OF INTERCONNECT LEADS TO SEMICONDUCTIVE DEVICES

BACKGROUND OF THE INVENTION

The present invention relates in general to thermal compression gang bonding of semiconductive devices and, more particularly, to thermal compression gang bonds obtained between copper and gold portions of structures for interconnecting the semiconductive device to a utilization circuit. Such connecting structures would include, for example, the lead frame, interconnect leads and the gang bonding bumps on the semiconductive device.

DESCRIPTION OF THE PRIOR ART

Heretofore, thermal compression gang bonding of semiconductive devices has been accomplished. In these prior bonds, a copper pattern of ribbon-shaped interconnect leads was plated with a nickel layer and the nickel layer was plated with gold to a thickness within the range of 30–60 microinches. The gold plated interconnect ribbon leads were thermal compression gang bonded to gold gang bonding bumps carried from and rising above the surface of the semiconductive device. During the thermal compression gang bonding step, the nickel layer served as a diffusion barrier under the gold layer so that a gold-to-gold bond was obtained between the gold plated copper interconnect lead and the gold gang bonding bump. A similar gold-to-gold thermal compression bond was obtained at the outer end of the interconnect lead between the gold plated interconnect lead and a gold plated lead frame.

One of the problems with this gold-to-gold thermal compression bonding technique is that the expense thereof is relatively high due to the cost of the gold employed in making the bonds.

SUMMARY OF THE PRESENT INVENTION

The principal object of the present invention is the provision of an improved method for thermal compression gang bonding of lead structures to a semiconductive device.

In one feature of the present invention, a copper portion of a structure for interconnecting a semiconductive device to a utilization circuit is thermal compression gang bonded to a gold portion of another such interconnect structure to produce a solid state interdiffusion of the copper and gold portions and to obtain upon cooling thereof a bonding interface between the copper and gold portions, such interface comprising a solid state interdiffusion of the copper and gold portions.

In another feature of the present invention the gold portion which is thermally compression bonded to the copper portion comprises a gold layer on a copper member with a diffusion barrier layer interposed between the gold layer and the copper member.

In another feature of the present invention, a gold layer on a lead frame structure is thermally compression bonded to a copper interconnect lead.

In another feature of the present invention the inner ends of copper interconnect lead structures are bonded to gold portions of gang bonding bumps by means of thermal compression bonds therebetween.

Other features and advantages of the present invention will become apparent upon a perusal of the following specification taken in connection with the accompanying drawings wherein:

BRIEF DESCRIPTION OF THE DRAWINGS

FIG. 1 is a plan view of a film type gang bonding tape having the metallic interconnect lead patterns thereon for thermal compression bonding to semiconductive chips or dies by an automatic gang bonding machine, FIG. 2 is an enlarged plan view of a portion of the structure of FIG. 1 delineated by line 2—2, FIG. 3 is an enlarged sectional view of a thermal compression die bonding head for gang bonding interconnect lead structures to gang bonding bumps on the semiconductive chip or die, FIG. 4 is an enlarged detail view of a portion of the structure of FIG. 3 delineated by line 4—4, FIG. 5 is a sectional view of an integrated circuit package having an integrated circuit die or chip mounted to a lead frame structure therein, FIG. 6 is an enlarged detail view of a portion of the structure of FIG. 5 delineated by line 6—6, and FIG. 7 is a detail view of an alternative embodiment of a portion of the structure of FIG. 6 delineated by line 7—7.

DESCRIPTION OF THE PREFERRED EMBODIMENTS

Referring now to FIGS. 1 and 2 there is shown the bonding tape 11 for use in an automatic thermal compression gang bonding machine for attaching the interconnect leads to the die. The tape 11 includes a wrought copper sheet 12 perforated at 13 along its opposite marginal edges to receive a sprocket drive wheel therein for advancing the tape from a supply reel through the automatic gang bonding machine. A plurality of interconnect ribbon lead patterns of metallic foil 14 are formed in the wrought copper foil 12, the typical pattern being shown in FIG. 2. A polyimide plastic film 15 is adhered to the underside of the copper sheet 12 for holding the interconnect lead portions 16 of the pattern 14 in the desired positions. A rectangular central aperture 18 is provided in the film 15 with the inner ends of the interconnect ribbon leads 16 extending over the lip of the rectangular aperture 18. A plurality of perforations 19 are disposed about the periphery of each of the interconnect lead patterns 14 to facilitate shearing of the foil 12 and the film 15 in a subsequent step of the bonding process.

Referring now to FIGS. 3 and 4, there is shown a portion of the die bonding machine for thermal compression gang bonding of the inner ends of the interconnect leads 16 to a plurality of gang bonding bumps 21 disposed about the periphery of a die or semiconductive chip 22.

The individual chips 22 include a semiconductive substrate portion 23 having an epitaxial $n$ type conductivity region 24 grown thereon. A plurality of $p+$ conductivity regions 25 are diffused into the $n$ region 24. An $n+$ conductivity region 26 is diffused into the $n$ epitaxial layer 24 for making electrical contact thereto. The upper surface of the $n$ layer 24 is coated with a passivation layer 27, as of silicon dioxide.

A plurality of apertures 29 are provided in the silicon dioxide layer 27 in registration with certain of the regions 25 and 26. An intraconnect pattern of metallization 28, as of aluminum, is deposited over the silicon dioxide layer and through the apertures 29 for making electrical contact to the $n+$ and $p+$ type regions. In certain regions, the gang bonding bumps 21 are deposited, as by electroplating, over the intraconnect pattern of metallization 28 for making electrical contact thereto. In a typical example, the gang bonding bumps 21 are one to 2 mils high and have a cross-section at their base of approximately 12 square mils. In other regions of the semiconductive die 22, the intraconnect pattern of metallization 28 is covered over with a second passivation layer 31, as of silicon dioxide.

The semiconductive die or chip 22 is carried from a glass plate 33 via a high temperature film 34 joined to the glass plate 33 via wax 35. The die is carried from the film 34 via the intermediary of a layer of release wax 36. The assembly is scored by saw kerfs 37 passing through the release wax and partially into the high temperature film 34.

The die bonding machine brings the individual chips 22, to be bonded, into registration with a die bonding tool 38, as of carbon, heated to a temperature of, for example, 550° C for gang bonding. The tool 38 is caused to press the inner ends of the interconnect leads 16 down onto the upper ends of the gang bonding bumps 21 with a pressure of approximately 100 grams per bump or 8 grams per square mil for a time of approximately 0.2 seconds. In a typical example, the bonding tool 38 gang bonds 14 gang bonding bumps simultaneously.

Each of the gang bonding bumps 21 includes a relatively thick base layer portion 39 of copper having a hardness greater than 50 Knoop. A layer of gold 41, as of 15 to 60 microinches thick, is disposed overlaying the copper layer 39 and a diffusion barrier 40, as of nickel, is interposed between the gold layer 41 and the underlying copper layer 39. In a typical example, the gold layer 41 to which the thermal compression bond is to be made has a thickness greater than 15 microinches and preferably in the range of 30–60 microinches. The nickel layer has a thickness as of 0.1 to 0.7 mils and the total height of the bump 21 falls within the range of 0.3–2.0 mils. The copper interconnect lead 16 is preferably coated with a very thin antioxidant coating such as, gold, copper phosphate, or chromate so that a thermal compression bond can be made through the very thin antioxidant layer 42. The use of an antioxidant coating over copper when thermal compression bonding to a copper member is disclosed and claimed in copending U.S. application Ser. No. 582,634 filed June 2, 1975.

A copper-to-gold thermal compression bond is obtained between the inner end of the copper interconnect lead 16 and the gold layer 41 on the thermal compression gang bonding bump 21 by pressing the copper lead into thermal compression bonding engagement with the gold layer 41, in the manner as previously described, so that a solid state interdiffusion of the copper, from the interconnect lead 16, is made with the gold layer 41 to obtain, upon cooling thereof, a bonding interface between the copper and gold portions such interface comprising a solid state interdiffusion of the copper and gold portions.

Diffusion barrier 40 serves to prevent diffusion of gold from the upper layer 41 into the underlying copper layer 39 due to the heating of the gold layer by the thermal compression bonding tool 38. Also, the diffusion barrier layer 40 prevents interdiffusion of the copper of lead 16 through the gold layer 41 into the copper layer 39. The resultant copper-to-gold thermal compression bonds have higher strength than copper-to-copper or gold-to-gold thermal compression bonds. In addition, the copper-to-gold bonds can be made with much less cost of materials and handling than previous gold-to-gold bonds because the interconnect lead 16 need not be plated with a diffusion barrier nor with a relatively thick gold layer as encountered in the prior art gold-to-gold bonds.

As an alternative to the use of the gold layer or cap 41, the entire bump 21 may be made of gold and a copper-to-gold thermal compression bond made thereto in the same manner as the thermal compression bond is made to the gold layer 41.

When the die 22 is gang bonded to the inner ends of the interconnect lead patterns 16 due to the heating of the die by the thermal compression tool 38, the wax releases the die and it is thereby transferred to the wrought copper sheet or tape 12. The tape 12, with the dies attached thereto, is fed through a second machine which thermal compression bonds the outer portions of the interconnect leads 16 to the inner ends of the lead frame members 43 (see FIGS. 5 and 6).

In case the lead frame 43 is made of copper, it is first plated with a barrier layer material 44, as of nickel, which is then selectively plated over with a layer of gold 45 to which the copper interconnect lead 16 is to be thermally compression bonded. The upper surface of the interconnect lead 16 which is to be bonded to the selectively plated gold layer 45 is preferably coated with an antioxidant coating as of gold, chromate, or copper phosphate to a thickness sufficiently thin to permit thermal compression bonding therethrough.

A thermal compression tool 46 is brought up against the lower side of the interconnect lead 16 for pressing the upper surface of the interconnect lead 16 into engagement with the lower surface of the gold layer 45. In a typical example, the temperature of the bonding tool 46 is 450° C and is held in engagement with the interconnect lead 16 for approximately 0.15 seconds. The bonding pressure, per square mil, is typically approximately three times the pressure utilized for bonding the inner ends of the interconnect lead 16 to the gang bonding bumps 21, i.e., 10–30 grams per square mil. The selective gold plating layer 45 has an area of, for example, 225 square mils interfacing with the interconnect lead 16.

Bond strengths achieved between the copper interconnect lead 16 and the gold layer 45 on the lead frame 43 are usually greater than 50 grams and have been as high as 200 grams for a 225 square mil thermal compression copper-to-gold interface bond area between the lead frame 43 and the outer end of the interconnect lead 16. After the lead frames 43 have been bonded to the interconnect lead 16, the lead frames are mounted in a molded epoxy package 48 as shown in FIG. 5.

As the thermal compression bond is made between the interconnect lead 16 and the inner ends of the lead frames 43, the copper interconnect lead pattern 14 is sheared along the line of the perforations 19, thereby transferring the lead attached die 22 from the tape 11 to the lead frame structure 43.

Referring now to FIG. 7 there is shown an alternative embodiment of the present invention wherein the lead frame 43 is made of nickel, alloy 42, or kovar. In such a case, the gold layer 45 is plated directly onto the lead frame 43 in the selected regions, as previously described, to a thickness preferably falling within the range of 50–60 microinches. As before, the copper interconnect lead 16 is preferably coated with an antioxidant coating and the members are brought into thermal compression bonding relation as described with regard to FIG. 6 to obtain a thermal compression bond between the gold layer 45 and the copper interconnect lead 16.

The advantage to the use of the copper-to-gold thermal compression bonds of the present invention for gang bonding lead structures to semiconductive devices is that relatively inexpensive copper members may be utilized with relatively expensive gold layers or bumps. The gold portions may be limited to the bump and to selected areas of the lead frame 43, thereby minimizing the use of gold and the cost of the parts. Also, stronger bonds are obtained than prior gold-to-gold or copper-to-copper bonds.

What is claimed is:

1. In a method for thermal compressing gang bonding of lead structures from a tape to a semiconductive device in an automatic gang bonding machine, such semiconductive device being of a type having a plurality of metallic gang bonding bumps rising above the surface of the semiconductive device and being connected at their bases to underlying patterns of metallization on the semiconductive device, and wherein at least one copper portion of a first structure operatively associated with the semiconductive device is to be thermal compression gang bonded to a gold portion of a second structure operatively associated with the semiconductive device, the steps of:
heating and pressing the copper portion of the first structure into thermal compression bonding relation with the gold portion of the second structure to produce a solid state interdiffusion between the copper and gold portions to obtain upon cooling thereof a final bonding interface between the copper and gold portions, such interface comprising a solid state interdiffusion of the copper and gold portions.

2. The method of claim 1 wherein the gold portion to be thermally compression bonded to said copper portion includes, an outer layer of gold disposed on one of said gang bonding bumps of copper, and including the step of interposing a diffusion barrier between said underlying copper of said bump and said gold layer thereon to serve as a diffusion barrier therebetween.

3. The method of claim 2 wherein said diffusion barrier layer is made of nickel.

4. The method of claim 1 including an outer lead frame member to which said gang bonding thermal compression bumps are to be connected via the intermediary of a copper interconnect lead structure forming the copper portion to be thermal compression bonded, and wherein said gold portion to be thermal compression bonded to said copper interconnect includes a gold layer on said lead frame member.

5. In a semiconductive device:
semiconductive chip means having a pattern of intraconnect metallization thereon for making electrical connection to various different subregions of said chip means and a plurality of gang bonding metallic bumps rising above the surface of the semiconductive chip means and being connected at their bases to said pattern of intraconnect metallication, said gang bonding bumps having a gold portion for gang bonding purposes;
lead frame means for electrically connecting the semiconductive device to other circuitry for use of said semiconductive device;
metallic interconnect means for electrically interconnecting said gang bonding bumps of said semiconductive chip means to said lead frame means and having a copper portion for gang bonding purposes; and
said interconnect means having said copper portion bonded to said gold portion of at least one of said gang bonding bumps via the intermediary of a final thermal compression bonding interface comprising a solid state interdiffusion of said copper and said gold portions of said interconnect means and said one gang bonding bump.

6. The apparatus of claim 5 wherein said gold portion of said one gang bonded bump comprises a layer of gold overlaying a copper region of said bump, and a thermal diffusion barrier layer of metal interposed between said gold layer and said copper region of said bump.

7. The apparatus of claim 6 wherein said diffusion barrier is of nickel.

8. The apparatus of claim 6 wherein said gold layer has a thickness in excess of 15 microinches.

9. In a semiconductive device:
semiconductor chip means having a pattern of intraconnect metallization thereon for making electrical connections to various different subregions of said chip means and including a plurality of gang bonding metallic bumps rising above the surface of said semiconductive chip means and being connected at their bases to said pattern of intraconnect metallization;
lead frame means for electrically connecting the semiconductive device to other circuitry for use of said semiconductive device and having a gold portion for bonding purposes;
metallic interconnect means for electrically interconnecting said gang bonding bumps of said semiconductive chip means to said lead frame means and having a copper portion for bonding purposes; and
said interconnect means having said copper portion thereof bonded to said gold portion of said lead frame means via the intermediary of a final thermal compression bonding interface comprising a solid state interdiffusion of said copper and said gold portions.

10. The apparatus of claim 9 wherein said gold portion of said lead frame means comprises a layer of gold overlaying a copper region of said lead frame means, and a thermal diffusion barrier layer of metal interposed between said gold layer and said copper region of said lead frame means.

11. The apparatus of claim 10 wherein said diffusion barrier is of nickel.

12. The apparatus of claim 9 wherein said gold layer has a thickness in excess of 15 microinches.

13. The apparatus of claim 9 wherein said lead frame means comprises an alloy of nickel.

14. The product made by the method of claim 1.

* * * * *